United States Patent [19]

Ono et al.

[11] Patent Number: 4,631,523

[45] Date of Patent: Dec. 23, 1986

[54] PULSE GENERATOR

[75] Inventors: Tadahiro Ono, Shizuoka; Shigenori Igarashi, Susono, both of Japan

[73] Assignees: Toshiba Kikai Kabushiki Kaisha; Toei Denki Kabushiki Kaisha, both of Tokyo, Japan

[21] Appl. No.: 743,493

[22] Filed: Jun. 11, 1985

[30] Foreign Application Priority Data

Jun. 12, 1984 [JP] Japan ................. 59-120289

[51] Int. Cl.⁴ ............................................. H03M 1/64
[52] U.S. Cl. ................. 340/347 SY; 328/133
[58] Field of Search ........ 340/347 SY; 318/603, 318/605, 661; 324/83 R–91; 328/133

[56] References Cited

U.S. PATENT DOCUMENTS

| Re. 26,451 | 9/1968 | Geller | 340/347 SY |
| 3,460,130 | 8/1969 | Lavin | 340/347 SY |
| 3,509,559 | 4/1970 | LeConte | 340/347 SY |
| 3,555,542 | 1/1971 | Guinot | 340/347 SY |
| 3,990,062 | 11/1976 | Miller | 340/347 SY |

Primary Examiner—Charles D. Miller
Attorney, Agent, or Firm—Cushman, Darby & Cushman

[57] ABSTRACT

A pulse generator includes a transducer such as a resolver coupled to a driven body for converting a mechanical motion thereof to a phase-modulated signal, an excitation signal generator for supplying an excitation signal as a carrier of the phase-modulated signal to the transducer, a clock pulse generator for generating a train of clock pulses, a waveform shaping circuit for shaping the waveform of the phase-modulated signal issued from the transducer, a counter for receiving the clock pulses to form a content of count representing a time interval by which the output from the waveform shaping circuit being in a high or low logical state is longer or shorter than the corresponding period of the excitation signal, a count pulse generator for generating count pulses, a gate circuit for allowing the count pulses to enter the counter until the counter having contents of count corresponding to the time interval is initialized while the output from the waveform shaping means is in its a succeeding low or high logical state, and an output gate circuit for issuing out the count pulses counted by the counter to issue out as a serial train of pulses.

7 Claims, 7 Drawing Figures

| A | $\overline{REA} \cdot CP2 \cdot \overline{BQ}$ |
| --- | --- |
| CP4 | $\overline{CP1 \cdot REA} + Q1A$ |
| CP3 | $\overline{BQ \cdot CP2 \cdot \overline{REA} \cdot \overline{CQ}}$ |
| B | $CA1 \cdot \overline{CP3} + \overline{CA1} \cdot CP3$ |

PULSE GENERATOR

BACKGROUND OF THE INVENTION

The present invention relates to a pulse generator, and more particularly to a pulse generator circuit employing a resolver for generating a train of pulses dependent on an angular displacement.

Conventional pulse generators employing resolvers for generating a series of pulses operates by generating a sine- or rectangular-wave excitation voltage signal from clock pulses, with a frequency-dividing counter, applying the excitation voltage signal to the primary winding of the resolver, counting, with a counter, the phase difference between the reference signal and an output generated from the secondary winding of the resolver, and issuing the output from the counter at a certain timing.

FIGS. 1 and 2 of the accompanying drawings illustrate a prior-art pulse generator circuit, in block form, and the waveforms of signals in the pulse generator circuit, respectively. As shown in FIG. 1, an input signal sin ωt applied to the primary winding of a resolver and a phase-modulated output signal sin (ωt+θ) issued from the secondary winding of the resolver are applied to an analog converter 21 which generates a phase-difference signal PH. The phase-difference signal PH and reference clock pulses CP are applied to an AND gate 22 which issues an output CPH to a counter 23 for counting applied pulses. The count value from the counter 23 is latched by a latch circuit 24 which delivers parallel signals to a parallel-to-serial converter circuit 25 for converting the applied parallel signals to a serial succession of pulses which is issued as an output.

FIG. 2 shows the waveforms of the input signal applied to the primary winding of the resolver, the output signal issued from the secondary winding of the resolver, the output from the comparator 21, and the output from the AND gate 22. More specifically, FIG. 2 illustrates at (A) the phase difference between the excitation signal sin t applied to the primary winding of the resolver and the phase-modulated signal sin (ωt+θ) issued from the secondary winding of the resolver. FIG. 2 shows at (B) the signal PH from the comparator 21, i.e., the rectangular-wave signal dependent on the phase difference. FIG. 2 shows at (C) reference clock pulses occurring during high-level intervals of the rectangular-wave signal PH. With the conventional arrangement shown in FIGS. 1 and 2, the anglular displacement θ is issued as an absolute anglular displacement. Therefore, if the frequency of the clock pulses is increased, then the number of output lines of the latch circuit 24 will have to be increased, resulting in a complicated circuit arrangement. Conversion from the parallel output to the serial output requires to be effected by the special processing circuit or converter circuit. Since the parallel-to-serial converter circuit is limited to a certain processing speed, the pulse generator circuit would be highly costly to construct if higher-speed operation were to be achieved.

SUMMARY OF THE INVENTION

It is a general object of the present invention to provide a pulse generator circuit which is capable of converting an output signal from a resolver directly to a pulse train without requiring a special processing circuit, can be manufactured inexpensively, and can be connected directly to a device designed for use with a pulse generator, such as a numerical control device.

According to the present invention, there is provided a pulse generator including a driven body, a transducer coupled to the driven body for converting a mechanical motion thereof to a phase-modulated signal, an excitation signal generating means for supplying an excitation signal as a carrier of the phase-modulated signal to the transducer, a clock pulse generator means for generating a train of clock pulses, a waveform shaping means for shaping the waveform of the phase-modulated signal issued from the transducer, a counter means for receiving the clock pulses to form a content of count representing a time interval by which the output from the waveform shaping means being in a high or low logical state is longer or shorter than the corresponding period of the excitation signal, a count pulse generator means for generating count pulses, a gate means for allowing the count pulses to enter the counter means until the counter means having contents of count corresponding to the time interval is initialized while the output from the waveform shaping means is in its succeeding logical state, and an output gate means for allowing the count pulses counted by the counter to issue out as a serial train of pulses.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
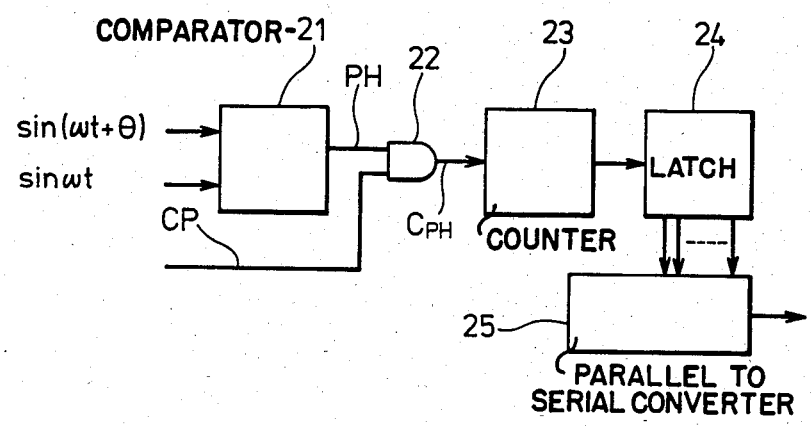
FIG. 1 is a block diagram of a conventional circuit arrangement for converting a phase-modulated signal to a series of pulses.
Figure 2:
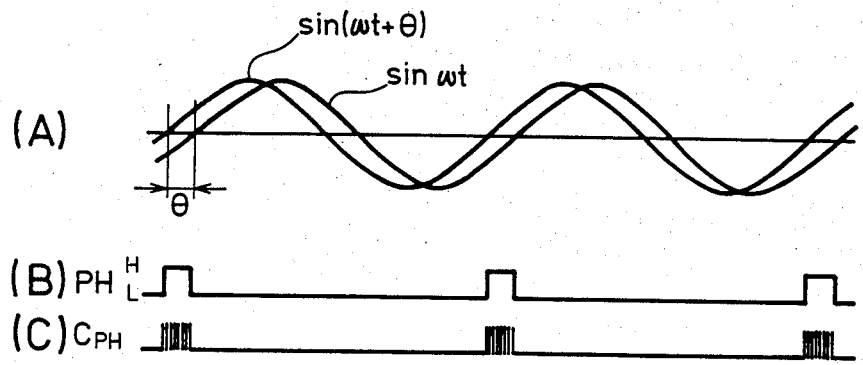
FIG. 2 is a diagram showing the waveforms of signals in the circuit arrangement shown in FIG. 1.

Prior to describing an embodiment of the present invention, the principles of a resolver for measuring an angular displacement will first be described below.

It is assumed that a reference clock pulse has a period $\Delta T$ and a frequency-dividing counter for counting reference clock pulses has a frequency-dividing ratio n. The speed of rotation in one cyclic period of a resolver which rotates at an angular velocity ωo is equal to the difference $\Delta TT$ between the period T of the resolver when it is at rest and the period TT thereof when it is in rotation. More specifically, the output voltage of the resover can be expressed by:

$$ER = \sin(\omega t + \theta)$$

Since $\omega=2\pi/n\Delta T$ and $\theta=\omega o \cdot t$,
$ER = \sin(\omega + \omega o)t$ Because the period of the resolver while it is rotating at the angular velocity $\omega o$ is $2\pi/(\omega+\omega o)$, the angular displacement $\theta$ of the resolver in one period is given by:

$$\theta = \omega o \cdot TT = \omega o \cdot 2\pi/(\omega+\omega o) \quad (1)$$

From the equation (1), we get $$2\pi/(\omega+\omega o) = (2\pi - \theta)/\omega \quad (2)$$

The difference between the period of the resolver when it is at rest and the period thereof when it is rotated at $\omega o$ is:

$$\Delta TT = 2\pi/\omega - 2\pi/(\omega+\omega o) \quad (3)$$

By putting the equation (2) into the equation (3), $$\Delta TT = \theta/\omega \quad (4)$$

Since $\omega = 2\pi/n\Delta T$, $$\Delta TT = n\Delta T/2\theta \quad (5)$$

The number OP of output pulses can be obtained by counting $\Delta TT$ with $\Delta T$, and is expressed by:

$$OP = \Delta TT/\Delta T = n \cdot \theta/2\pi \quad (6)$$

The equation (6) indicates that the number of output pulses is rendered proportional to the angular displacement $\theta$ by counting the difference between the periods of the resolver when it is at rest and in rotation, respectively, and is independent of the angular velocity $\omega o$.

An embodiment of the present invention based on the foregoing principles will now be described.

Figure 3:
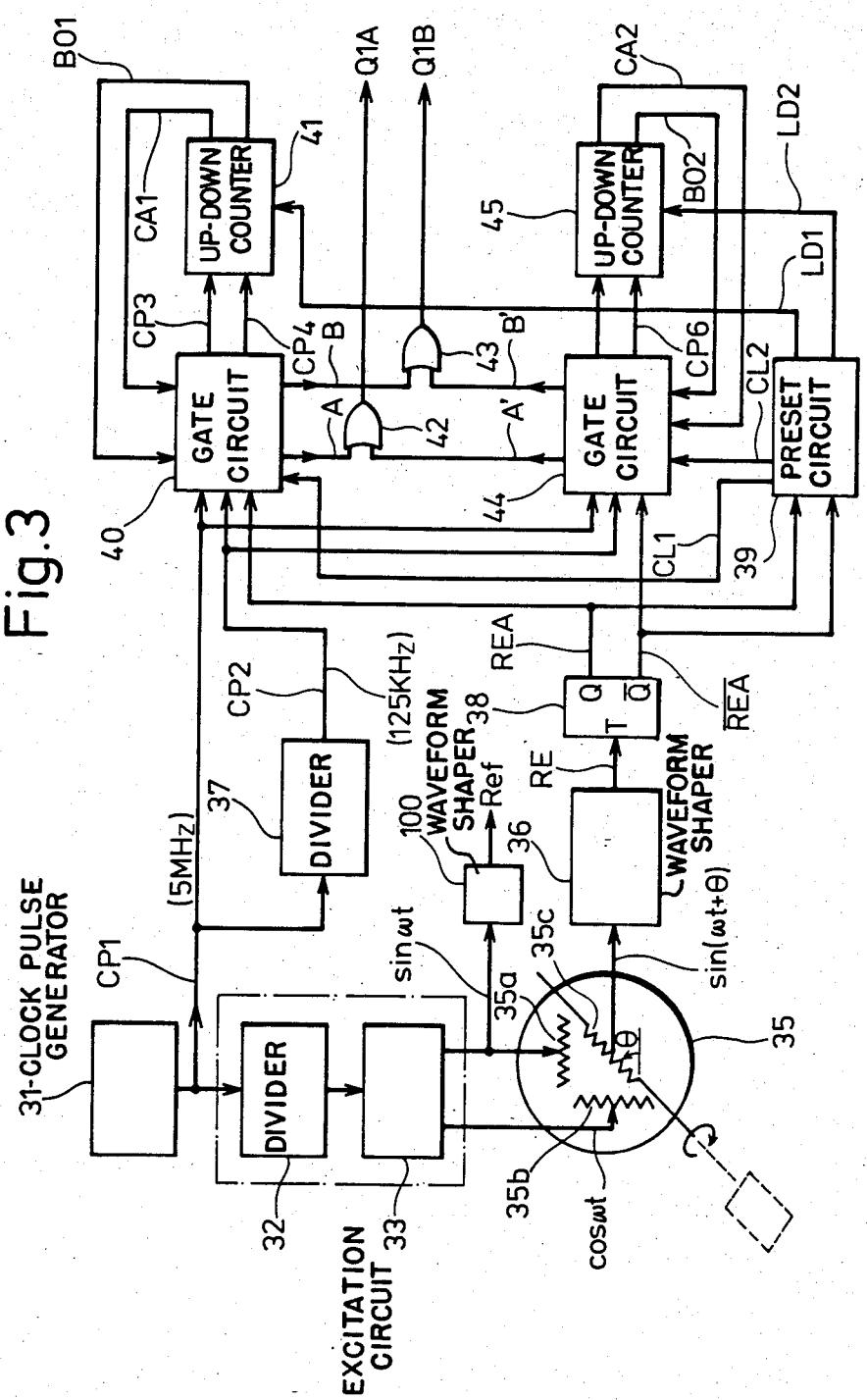
FIG. 3 is a block diagram of a pulse generator circuit according to the present invention.

FIG. 3 shows in a block from a pulse generator circuit according to the present invention. The pulse generator circuit includes a clock pulse generator 31 for generating clock pulses CP1 having a frequency of 5 MHz, for example, which are frequency-divided by a first frequency-dividing counter 32. The first frequency-dividing counter 32 applies an output signal to an excitation circuit 33 which excites the primary windings of a resolver 35. The excitation circuit 33 supplied sine-wave excitation signals sin $\omega t$ and cos $\omega t$ to the primary windings 35a and 35b, respectively.

The resolver 35 has a secondary winding 35c which induces and applies a phase-modulated signal sin $(\omega t + \theta)$ containing information on the angular displacement of the rotor of the resolver to a waveform shaping circuit 36. The waveform shaping circuit 36 shapes the waveform of the phase-modulated signal sin $(\omega t + \theta)$ to generate a rectangular-wave signal RE. The signal RE is applied to the T input terminal of a toggle-type flip-flop 38 which issues signals REA and $\overline{REA}$ respectively from its output terminals Q and $\overline{Q}$.

The pulse generator circuit also includes a second frequency-dividing counter 37 for frequency-dividing the reference clock pulse signal CP1 to produce a signal CP2 having a frequency selected to be higher than that of the output from the first frequency-dividing counter 32. However, the second frequency-dividing counter 37 may be dispensed with, and the reference clock pulses CP1 may be directly fed to the gate circuit 40 as indicated by the broken line in FIG. 3. A gate circuit 40 serves to control the supply of counted input pulses to an up/down counter 41. More specifically, the gate circuit 40 is supplied with the reference clock pulse signal CP1, the output CP2 from the second frequency-dividing counter 37, and the Q output REA from the flip-flop 38. The gate circuit 40 is also supplied with a carry signal CA1 and a borrow signal BO1 from the up/down counter 41, and a clear signal CL1 from a preset circuit 39.

The Q and $\overline{Q}$ outputs REA, $\overline{REA}$ from the flip-flop 38 are fed to the preset circuit 39. The preset circuit 39 is responsive to the signal REA for issuing a load signal LD1 for initialization by loading a certain numerical value into the up/down counter 41. A gate circuit 44 is supplied with the $\overline{Q}$ output $\overline{REA}$ from the flip-flop 38, the reference clock pulse signal CP1, the output CP2 from the second frequency-dividing counter 37, a clear signal CL2 from the preset circuit 39, and carry and borrow signals CA2, BO2 from an up/down counter 45.

The preset circuit 39 is responsive to the signal $\overline{REA}$ for applying a load signal LD2 for initialization by loading a certain numerical value into the up/down counter 45.

The gate circuit 40 applies pulse signals CP3, CP4 respectively to the up- and down-counting terminals of the up/down counter 41. Similarly, the gate circuit 44 applies pulse signals CP5, CP6 respectively to the up- and down-counting terminals of the up/down counter 45. The gate circuits 40, 44 issue signals A, A', respectively, to an OR gate 42 which produces as an output a pulse-train signal Q1A corresponding to an angular displacement $\theta$ at the time the resolver 35 rotates clockwise, for example. Likewise, the gate circuits 40, 44 issue signals B, B', respectively, to an OR gate 43 which produces as an output a pulse-train signal Q1B corresponding to an angular displacement at the time the resolver 35 rotates counter-clockwise, for example.

Figure 5:
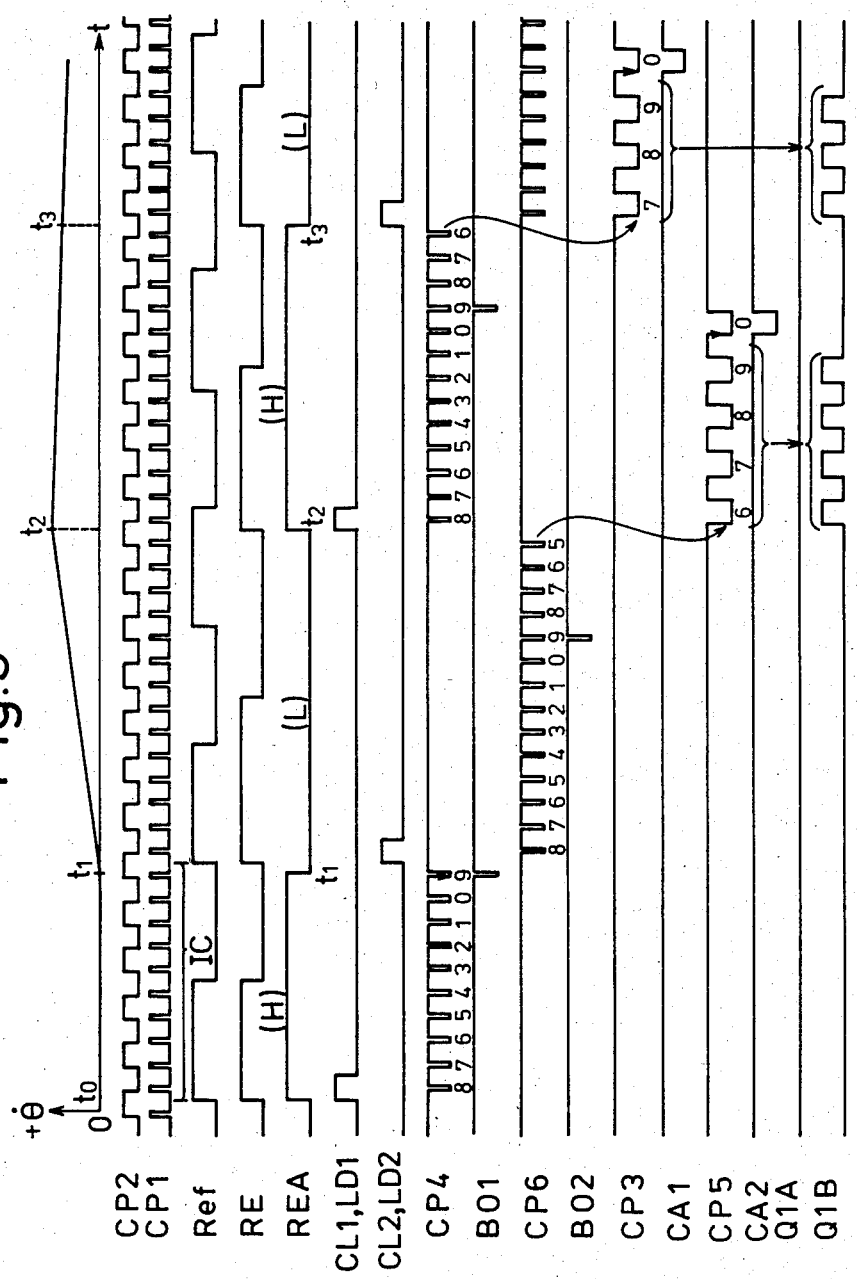
FIG. 5 is a timing chart of signals produced in the pulse generator circuit of FIG. 3 when the resolver rotates counterclockwise from a stop position.
Figure 6:
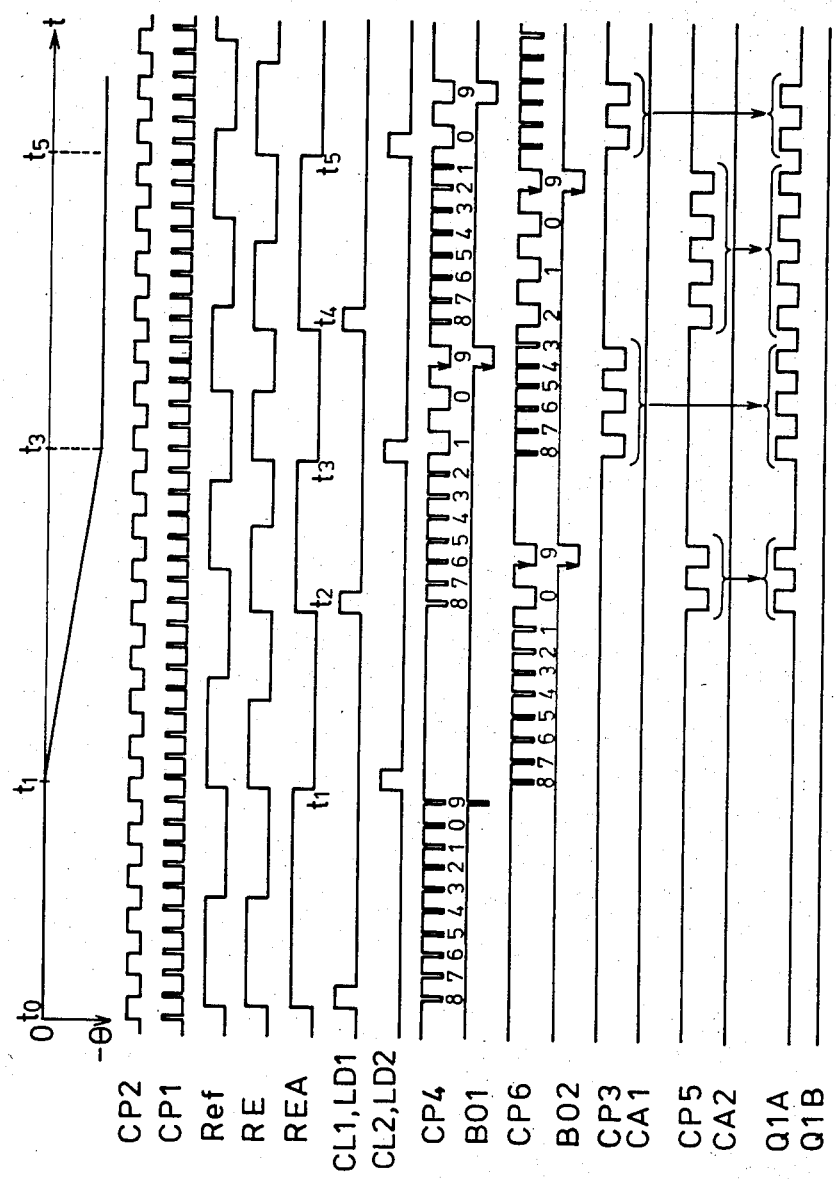
FIG. 6 is a timing chart of signals produced in the pulse generator circuit of FIG. 3 when the resolver rotates counterclockwise from the stop position.

The pulse generator circuit of FIG. 3 also includes a waveform shaping circuit 100 for shaping the waveform of the excitation signal sin $\omega t$ from the excitation circuit 33. The waveform shaping circuit 100 generates an output Ref as shown in FIGS. 5 and 6 as described later on. It will readily be understood that the signal Ref is used advantageously for comparison between the waveforms in the timing charts of FIGS. 5 and 6.

In the circuit arrangement of FIG. 3, the frequency of the reference clock pulse signal CP1 is preferably selected to be 5 MHz, and the frequency of the output CP2 from the second frequency-dividing counter 37 is selected to be 125 KHz. A numerical value 1000 is preset in the up/down counter 41 in response to the load signal LD1 applied from the preset circuit 39. The numerical value 1000 corresponds to the number of reference clock pulses CP1 present in one period of the frequency-divided output from the first frequency-dividing counter 32.

When the Q output signal REA from the flip-flop 38 goes high, the preset circuit 39 applies the load signal LD1 to the up/down counter 41 to preset the up/down counter 41 to the numerial value 1000.

The preset circuit 39 also applies the clear signal CL1 to the gate circuit 40 which in turn applies the reference clock pulses CP1 as the signal CP4 to the down-counting terminal of the up/down counter 41. The up/down counter 41 continues to count down the applied pulses while the signal REA is in the high state. When the signal REA goes low, the gate circuit 40 stops supplying the reference clock pulses CP1 to the up/down counter 41. If the count of the up/down counter 41 at the time the signal REA goes low is not 0, then the gate circuit 40 supplies the output CP2 from the second frequency-dividing counter 37 to either the up-counting terminal or the down-counting terminal of the up/down counter 41 in order to eliminate the count of the up/down counter 41. Whether the count of the up/down counter 41 is zero or not can be determined by the gate circuit 40 based on the generation of the borrow signal BO1 or the carry signal CA1. When the carry signal CA1 or the borrow signal BO1 is generated from the up/down counter 41, the gate circuit 40 stops receiving the output CP2 from the second frequency-dividing counter 37. The signal A from the gate circuit 40 is generated in synchronism with the output CP2 of the second frequency-dividing counter 37. The signal A corresponds to the number of pulses of the signal CP2 which are applied to the down-counting terminal of the up/down counter 41. The signal B corresponds to the number of pulses of the signal CP2 which are applied to the up-counting terminal of the up/down counter 41. The gate circuit 44 and the up/down counter 45 operate in the same manner as described above in response to the $\overline{Q}$ output signal $\overline{REA}$. The gate circuits 40, 44 thus operate alternately as the signals REA, $\overline{REA}$ are produced alternately.

Therefore, the signal A' from the gate circuit 44 and the signal A from the gate circuit 40 are applied in alternate half periods to the OR gate 42 to enable the same to issue the signal Q1A. Likewise, the signals B, B' are generated in response to the signal $\overline{REA}$ to enable the OR gate 43 to issue the signal Q1B.

Figure 4:
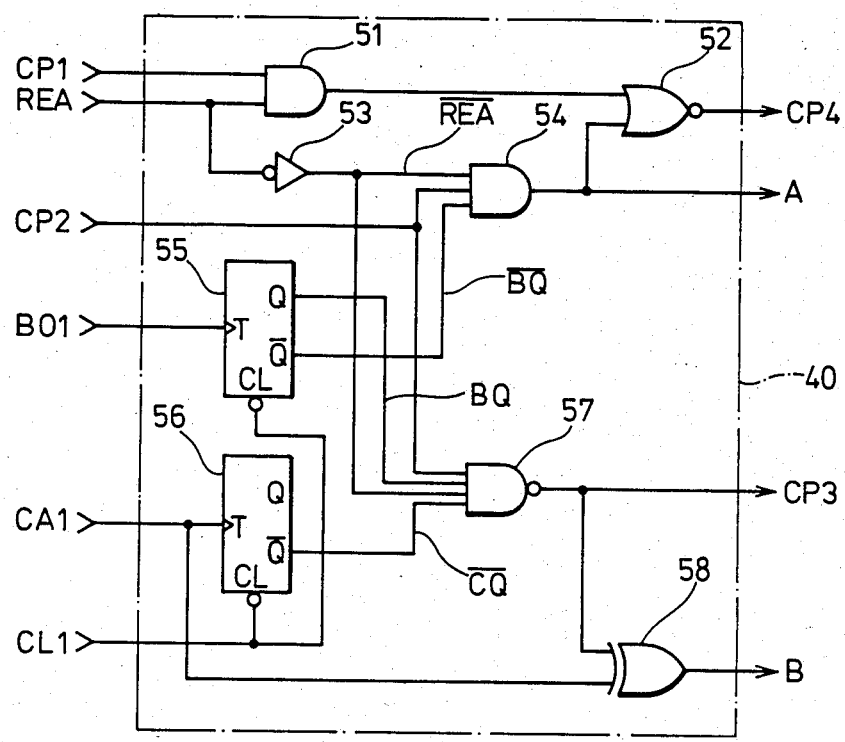
FIG. 4A is a block diagram showing a gate circuit in detail of the pulse generator circuit of FIG. 3.
FIG. 4B is a table of the logical expressions of outputs from the gate circuit illustrated in FIG. 4A.

FIG. 4A shows the gate circuit 40 in greater detail. The reference clock pulse signal CP1 and the signal REA are applied to an AND gate 51 which issues an output to one input terminal of a NOR gate 52. The signal REA is also applied through an inverter 53 to an AND gate 54 which issues the signal A to the other input terminal of the NOR gate 52. The NOR gate 52 produces the signal CP4. The signal A issued from the AND gate 54 is the same as the output CP2 from the second frequency-dividing counter CP2 while the signal $\overline{REA}$ is of the high level and there is no borrow signal from the up/down counter 41. The borrow signal BO1 is applied to the T input terminal of a toggle flip-flop 55 which issues a Q output to the AND gate 54.

The output signal CP3 is issued from an NAND gate 57, and is in synchronism with the output CP2 from the second frequency-dividing counter 37 when the borrow signal BO1 is given, the signal $\overline{REA}$ is also given, and there is no carry signal CA1. The signal B is produced from an exclusive-OR gate 58 by exclusive-ORing the signal CP3 and the carry signal CA1.

The signal CP4 is rendered equal to the reference clock pulse signal CP1 by the NOR gate 52 when there is no signal A. FIG. 4B shows the logical expressions of the signals A, B, CP3, and CP4.

FIG. 5 is a timing chart of the signals in the circuit arrangement of FIG. 3. For an easier understanding, the timing chart shows ten reference clock pulses CP1 in one cycle of the excitation frequency of the resolver, and the output CP2 from the second frequency-dividing counter 37 is of a frequency which is half that of the reference clock pulse signal CP1. It is assumed that the resolver is at rest from a time t0 to a time t1 and rotates counterclockwise from the time t1 to a time t2 and a time t3.

Up to the time t1, the signal REA applied to the gate circuit 40 remains high and the up/down counter 41 counts down the clock pulses CP1. Since the up/down counter 41 has been initially set to 9 by the load signal LD1, the signal CP4 applied to the down-counting terminal of the up/down counter 41 is counted down thereby in the sequence of 8, 7, 6, 5, 4, 3, 2, 1, 0, 9. When the last clock pulse is applied, the up/down counter 41 generates a borrow signal BO1 which enables the gate circuit CP1 to stop receiving the pulse signal CP1. From the time t1 to the time t2, the signal REA is low and hence the signal $\overline{REA}$ is high. The gate circuit 44 now applies the clock pulses CP1 to the down-counting terminal of the up/down counter 45. Inasmuch as the resolver has started rotating counterclockwise, fourteen (14) clock pulses are applied to the up/down counter 45 while the signal $\overline{REA}$ remains high. Therefore, the up/down counter 45 counts the pulses down to 5 as shown in FIG. 5. Although a borrow signal BO2 is generated at the count 9, the up/down counter 45 continues counting down the pulses since the signal $\overline{REA}$ is high. From the time t2 to the time t3, the speed of rotation of the resolver is reduced. In this interval, the signal REA is high to enable the gate circuit 40 to supply thirteen (13) clock pulses to the down-counting terminal of the up/down counter 41. Although a borrow signal BO1 is generated at the count 9, the gate circuit 40 continuously counts down to 6 as the signal REA is high and then stops counting down the pulses. Since the count of the up/down counter 45 at the time t2 is 5, five (5) pulses of the signal CP5 are applied to the up-counting terminal of the up/down counter 45 in order to eliminate the count therefrom when the next signal $\overline{REA}$ is low. When the last pulse of the output CP5 is applied, the up/down counter 45 issues a carry signal CA2 to the gate circuit 44 which then stops receiving the pulse signal CP2. Likewise, inasmuch as the count of the up/down counter 41 is 6 at the time t3, the gate circuit 40 applies four (4) pulses of the signal CP3 to the up-counting terminal of the up/down counter 41. When the last pulse of the signal CP3 is applied, a carry signal CA1 is applied from the up/down counter 41 to the gate circuit 40 to cause the same to stop receiving the signal pulses CP2. The signal Q1B is the combination of the signals B, B' produced by the OR gate 43. The last respective pulses of the signals CP3, CP5 are not given to the signal Q1B because of the exclusive-OR gate 58.

The signals are produced as shown in FIG. 6 when the resolver rotates clockwise. From the time t0 to the time t1, the resolver is kept at rest, and from the time t0 on, the resolver rotates clockwise. In FIG. 6, while the signal REA or $\overline{REA}$ is high from the time t0 on, the up/down counter 41 or 45 does not issues a borrow signal since the count does not change from 8 quickly to 0 during that interval. In a next half period, the down-counting terminal of the up/down counter 41 or 45 is continuously supplied with the clock pulses CP2 as the signal CP4 or CP6 until a borrow signal is produced. More specifically, the signal $\overline{REA}$ is high between the times t1 and t2, and eight (8) pulses of the signal CP6 are fed to the up/down counter 45 during this interval. When the count 1 is reached, the signal $\overline{REA}$ goes low. During the next half period from the time t2 to t3, the clock signal CP2 is applied through the gate circuit 44 to the down-counting terminal of the up/down counter 45 which has successive counts 0, 9. At the count 9, the up/down counter 45 issues a borrow signal BO2 to enable the gate circuit 44 to stop receiving the pulses CP2.

The signal REA remains high from the time t2 to the time t3. During this interval, the up/down counter 41 counts down the pulses from 8 to 2. During the next half period from the time t3 to the time t4, the clock signal CP2 is continuously applied as CP4 to the down-counting terminal of the up/down counter 41 which has successive counts 1, 0, 9. At the count 9, the up/down counter 41 produces a borrow signal BO1 to enable the gate circuit 40 to block the signal CP2. The numbers of clock pulses of the signal CP2 applied to the down-counting terminals of the up/down counters 41, 45 are issued as the signals A, A', respectively, which are delivered through the OR gate 42 as the signal Q1A.

With the present invention, as described above, a phase-modulated signal can be converted to a serial train of pulses through a simple circuit arrangement by supplying pulses through gate circuits to the up- and down-counting terminals of up/down counters. Since the pulse generator circuit of the invention is simple in construction, it can be manufactured inexpensively.

While a resolver is illustrated by way of example as a detector or a transducer for generating a phase-modulated output, other detectors for generating a phase-modulated output such as an Inductosyn may be employed.

Although a certain preferred embodiment has been shown and described, it should be understood that many changes and modifications may be made therein without departing from the scope of the appended claims.

What is claimed is:

1. A pulse generator comprising:
   (a) a driven body;
   (b) a transducer coupled to said driven body for converting a mechanical motion thereof to a phase-modulated signal;
   (c) excitation signal generating means for supplying an excitation signal as a carrier of the phase-modulated signal to said transducer;
   (d) clock pulse generator means for generating a train of clock pulses;
   (e) waveform shaping means for shaping the waveform of the phase-modulated signal issued from said transducer;
   (f) counter means for receiving said clock pulses to form a content of count representing a time interval by which the output from said waveform shaping means being in a high or low logical state is longer or shorter than the corresponding period of said excitation signal;
   (g) count pulse generator means for generating count pulses;
   (h) gate means for allowing the count pulses to enter said counter means until said counter means having contents of count corresponding to said time interval is initialized while the output from said waveform shaping means is in its succeeding logical state; and
   (i) output gate means for allowing the count pulses counted by said counter to issue out as a serial train of pulses.

2. A pulse generator according to claim 1, wherein said excitation signal generating means includes said clock pulse generator means.

3. A pulse generator according to claim 1, wherein said count pulse generator means comprises a frequency-dividing circuit for frequency-dividing said clock pulses generated by said clock pulse generator means.

4. A pulse generator according to claim 1 wherein said transducer comprises a resolver.

5. A pulse generator according to claim 1, wherein said counter means comprises first and second up/down counters, said gate means comprising first and second gate circuits associated respectively with said first and second up/down counters, including a flip-flop connected to an output terminal of said waveform shaping means in response to an each positive-going transient of the output from said waveform shaping means for inverting an output of the flip-flop to open and close said first and second gate circuits alternately.

6. A pulse generator according to claim 5, wherein said gate means further comprises a preset circuit connected to said first and second up/down counters for setting said first and second up/down counters to a preset value in response to the outputs of said flip-flop are high, the arrangement being such that said first and second up/down counters count said reference clock pulses from said preset value.

7. A pulse generator according to claim 5, wherein said count pulse generator means comprises a frequency-dividing counter, said first and second gate circuits being receptive of said reference clock pulses, and output from said frequency-dividing counter, borrow and carry signals from said first and second up/down counters, respectively, for supplying said reference clock pulses to the down-counting terminals of said first and second up/down counters for allowing the output of said frequency-dividing counter to pass to the down-counting or up-counting terminals of said first and second up/down counters until the contents of counts of said up/down counters become the preset value, and for allowing the serial train of pulses in synchronism with the output from said frequency-dividing counter to issue out.

* * * * *